United States Patent [19]

Ceresara et al.

[11] Patent Number: 4,554,407
[45] Date of Patent: Nov. 19, 1985

[54] SUPERCONDUCTING CONDUCTORS HAVING A STABILIZING SHEATH BRAZED TO ITS MATRIX AND A PROCESS FOR MAKING THE SAME

[75] Inventors: Sergio Ceresara, Lucca; Mario Brogi, Piano di Coreglia, both of Italy

[73] Assignee: La Metalli Industriale S.p.A., Italy

[21] Appl. No.: 625,556

[22] Filed: Jun. 28, 1984

[30] Foreign Application Priority Data

Dec. 23, 1983 [IT] Italy ................. 68346 A/83

[51] Int. Cl.⁴ ..................... H01B 12/00; H01B 13/00
[52] U.S. Cl. ................... 174/128 S; 29/599; 174/126 S
[58] Field of Search ............... 174/126 S, 128 S, 155; 29/599

[56] References Cited

U.S. PATENT DOCUMENTS 3,596,349  8/1971  Boom .................................. 29/599
4,200,767  4/1980  Nomura et al. ................. 174/126 S
4,242,536  12/1980  Young ............................. 174/128 S

FOREIGN PATENT DOCUMENTS 902802  6/1972  Canada ................................ 29/599
76698  7/1978  Japan ............................. 174/128 S Primary Examiner—A. T. Grimley
Assistant Examiner—Morris H. Nimmo
Attorney, Agent, or Firm—Shlesinger Arkwright Garvey & Fado

[57] ABSTRACT

A process is described for the production of superconducting conductors of the type comprising a plurality of filaments of an alloy containing niobium and titanium as base materials and a composite matrix of copper, aluminium or alloys of these elements, in which the filaments are disposed, and which serves to stabilize the superconductor; the process includes at least a first phase of preparing a first superconducting conductor comprising:

the said filaments and a first matrix of copper, aluminum or alloys of these elements;
a second phase of preparing a strip of copper, aluminum or alloys of these elements of width substantially equal to the perimeter of the section of the said first superconducting conductor;
a third phase of depositing a layer of brazing material on the outer surface of the said first superconducting conductor and at least on one of the surfaces of the said strip;
a fourth phase of connecting the said first superconducting conductor with the said strip and for shaping the strip itself by plastic deformation about the conductor in such a way that this latter is completely surrounded by the strip;
a fifth phase of heat treatment of the assembly obtained in the preceding phases to cause fusion of the said brazing material and therefore connection by brazing between the said first superconducting conductor and the said strip surrounding it.

8 Claims, 4 Drawing Figures

SUPERCONDUCTING CONDUCTORS HAVING A STABILIZING SHEATH BRAZED TO ITS MATRIX AND A PROCESS FOR MAKING THE SAME

BACKGROUND OF THE INVENTION

The present invention relates to a process for the production of superconducting conductors of the type comprising a plurality of filaments of an alloy containing niobium and titanium as base materials, and a composite matrix of copper, aluminium or alloys of these elements in which the filaments are disposed, and which serves to stabilise the superconductor.

As is known, superconducting conductors are normally constituted by a plurality of filaments of a niobium/titanium alloy embedded in a matrix, normally of copper, which has substantially the form of an integral continuous solid of constant cross-section in which the said filaments are embedded, and which serves both a mechanical function and, above all, the function of stabilizing the superconductor, that is to say of the providing an alternative path for the current when the superconductor section passes to the normal state. The said matrix, instead of being copper, can be made of another material such as aluminium or an alloy of aluminium or copper.

These conductors are normally utilized for applications in which there are magnetic fields. For particular applications a particularly strong stabilisation is required, which can only be obtained with a high ratio between the volume of the material of the matrix to the volume of the material of the filaments, which ratio can in some cases be greater than 10. In these conditions, instead of fabricating a superconducting conductor having a single matrix with a very high volume with respect to that of the filaments disposed in it, it is more convenient from the economical point of view, and more reliable from a technical point of view, to provide a composite matrix obtained by coupling a superconductor conductor having a relatively low value of the above defined ratio, for example lying between 1 and 2, with a blank or casing of copper (or aluminium or other alloy) in which the superconducting conductor is inserted. To make a superconducting conductor having a composite matrix obtained in this way a process is used which substantially comprises the following phases.

In a blank having a suitable cross-section, which is normally rectangular, there is formed a longitudinal groove with a substantially U-shape form and subsequently, into this groove, there is inserted a superconducting conductor having a rectangular section, and this latter is connected both mechanically and electrically to the blank itself by means of a layer of brazing material disposed between the outer surface of the conductor and the inner surface of said groove. The superconducting conductor obtained with this process has various disadvantages.

Above all, the electrical and heat exchange between the inner superconducting conductor within the blank and this blank itself takes place only on 3 of the 4 faces of the conductor. Moreover, the electrical axis of the superconducting conductor thus obtained (which coincides with the geometric axis of the filaments disposed in it) does not coincide with the geometric axis of the conductor itself. Moreover, the process described can only be used with superconducting conductors having rectangular sections since with those having circular sections it is not possible to effect the above described connection between the conductor and the blank. Moreover, the described process comprises numerous phases, some of which are intended to the preparation of the blank into which the initial superconducting conductor must be inserted. Finally, this process is difficult to perform when the section of the superconducting conductor is very small, a condition which occurs when the maximum transverse dimension thereof is less than 4 or 5 mm.

SUMMARY OF THE INVENTION

The object of the present invention is to provide a process for the production of superconducting conductors which will be free from the above mentioned disadvantages, which will be quick and easy to perform and which can be used even for the production of conductors having transverse dimensions less than 4 or 5 mm.

The present invention is also intended to comprehend a superconducting conductor produced by the process of the invention.

According to the present invention, therefore, there is provided a process for the production of superconducting conductors of the type comprising a plurality of filaments of an alloy containing niobium and titanium as base materials and a composite matrix of copper, aluminium or alloys of these elements, in which the filaments are disposed and which serves to stabilise the superconductor, the ratio between the volume of the material of the said matrix and the volume of the said filaments being greater than 1, characterised by the fact that it comprises at least a first phase of preparing a first superconducting conductor comprising:

the said filaments and a first matrix of copper, aluminium or alloys of these elements.

A second phase of preparing a strip of copper, aluminium or alloys of these elements, of width substantially equal to the perimeter of the cross-section of the said super-conducting conductor.

A third phase of depositing a layer of brazing material on the outer surface of the said first superconducting conductor and on at least one of the surfaces of the said strip.

A fourth phase of connecting the said first superconducting conductor to the said strip and of shaping the strip itself by plastic deformation about the conductor in such a way that this latter is completely enclosed within the strip.

A fifth phase of heat treatment of the assembly obtained in the preceding phases for causing fusion of the said brazing material and therefore a brazed connection between the said superconducting conductor and the said strip enclosing it.

BRIEF DESCRIPTION OF THE DRAWINGS

For a better understanding of the process of the present invention the fundamental phases of the process itself will now be described in detail with reference to the figures of the attached drawings, in which.

DETAILED DESCRIPTION OF THE INVENTION

Figure 1:
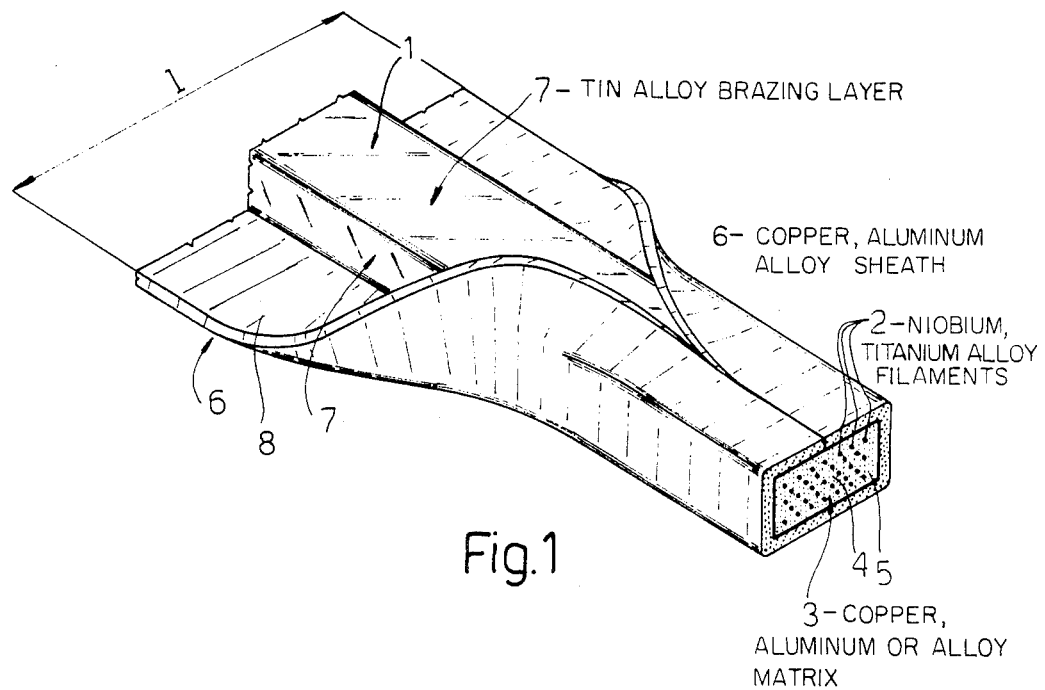
FIG. 1 is a perspective and schematic view of one of the phases of the process, utilized for the production of a superconducting conductor having substantially rectangular cross-section.
Figure 2:
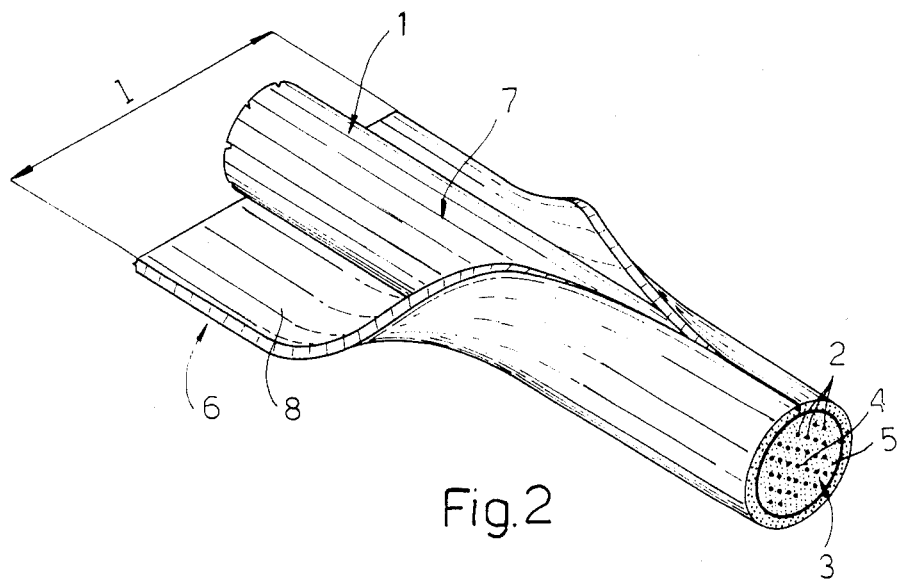
FIG. 2 is a perspective view of the same phase of the process utilized for the production of a superconducting conductor of circular cross-section.
Figure 3:
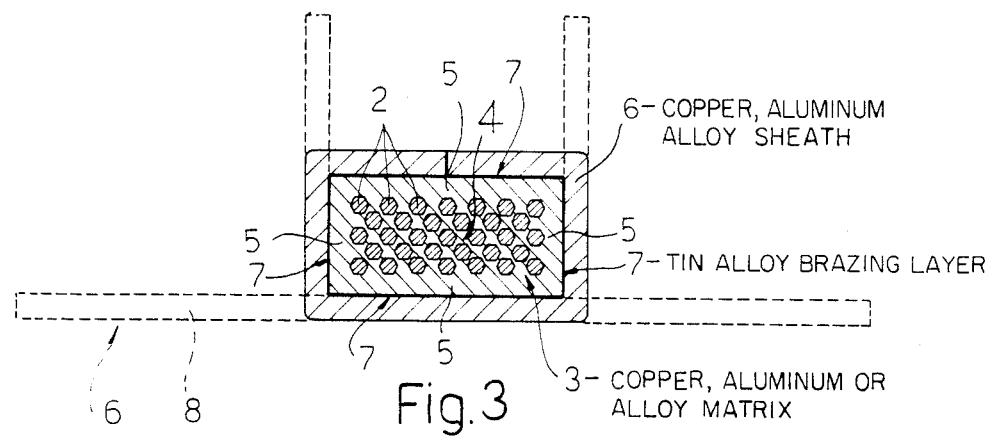
FIG. 3 is a section taken on a plane normal to the axis of a superconducting conductor of rectangular section obtained from the process of the invention.
Figure 4:
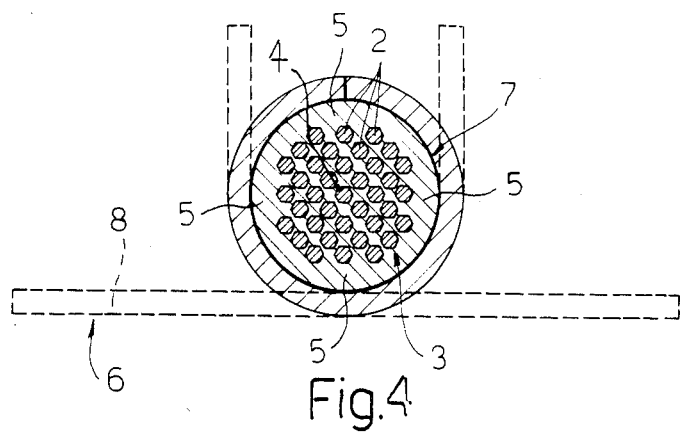
FIG. 4 is a section taken on a plane normal to the axis of a superconducting conductor of circular cross-section obtained by the process of the invention.

Referring first to FIGS. 1 and 2, to perform the process of the invention a first superconducting conductor, indicated at 1 in the drawings, of any cross-section, for example rectangular or circular as has been shown respectively in FIGS. 1 and 2 is used, which comprises a plurality of filaments 2 of an alloy containing niobium and titanium as base materials and a first matrix 3 of copper, aluminium or alloys of these elements, in which the said filaments are embedded. In the embodiments of FIGS. 3 and 4 also the matrix 3 of the first superconducting conductor substantially comprises a central part 4 in which the filaments are disposed, separated from one another by a wall of suitable thickness, and a peripheral more external part 5. The structure of this conductor can be any desired form. The matrix 3 serves both a mechanical function and, above all, the function of stabilizing the superconductor, that is to say of providing an alternative path for the current when a section of the superconductor converts to normal state; it is convenient for the purpose of preserving the integrity of the filaments during plastic working if the ratio between the volume of the material of the matrix 3 and the volume of the material of the filaments 2 is relatively low, for example less than two.

The superconducting conductor 1, which is known per se, can be prepared in any convenient manner utilising the usual techniques.

The process of the invention comprises at least a first phase for preparing the superconducting conductor 1 having the structural characteristics described above. The process further comprises a second phase for preparing a sheathing strip of copper, aluminium or alloys of these elements, indicated at 6 in the drawings, the width 1 of which is subantially equal to the perimeter of the cross-section of the superconducting conductor 1.

In a third phase of the process a layer of brazing material, for example an alloy of tin, is deposited on the outer surface 7 of the superconducting conductor 1 and at least on one of the surfaces 8 of the strip 6; this phase can be performed in any convenient manner by making the strip and the conductor pass through a suitable bath in which the brazing material is held in liquid form.

Subsequently, in a fourth phase of the process, the strip 1 is connected to the superconducting conductor by superimposing this latter over the former and in contact therewith, as can be seen in the left part of FIGS. 1 and 2; in the same phase this strip is shaped by plastic deformation to surround the conductor in such a way that this latter is completely enclosed in the strip as is clearly shown in the right hand parts of FIGS. 1 and 2. This plastic deformation operation can be performed in any convenient manner, for example by inserting the assembly constituted by the sheath strip 6 and the superconducting conductor 1 disposed on it into a draw plate which has active surfaces able to impart to the strip, whilst it moves across the draw plate, successive deformations according to the configurations shown in FIGS. 1 and 2 until it completely encloses the conductor.

The process then comprises a fifth phase for heat treatment of the assembly obtained in the preceding phases in such a way as to cause fusion of the brazing material which has been deposited on the outer surfaces 7 of the conductor and on the surface 8 of the strip, for the purpose of forming a brazed connection between the conductor itself and the strip enclosing it. After this phase there can possibly follow a finishing phase for imparting desired dimensions and external finish to the assembly.

The thickness of the sheath 6 is chosen in such a way as to obtain a high ratio in the superconducting conductor of the invention between the sum of the volumes of the material of the matrix 3 of the superconducting conductor 1 and the strip 6 and the volume of the filaments 2, in any case greater than one. When a particularly strong stabilization of the conductor of the invention is required the said ratio can be particularly high and even greater than ten.

The superconducting conductor obtained with the process of the invention has numerous favourable properties. Above all the superconducting conductor thus obtained can be considered as a composite matrix which is constituted partially by the matrix 3 of the initial superconducting conductor 1 and partially by a sheath constituted by the strip 6 within which the conductor itself is enclosed. This matrix, even though it is composed in reality of different parts, behaves as if it were formed of the same material both from the mechanical and the electrical point of view, because of the perfect connection formed by the layer of brazing material interposed between the conductor 1 and the strip 6.

It is therefore apparent that the superconducting conductor thus obtained can have particularly high values of the first defined ratio and well above those obtainable with superconducting conductors provided with a matrix formed in a single piece.

Moreover, the superconducting conductor of the invention has an electrical axis which coincides with the geometric axis of the conductors themselves so that the centre of gravity of the current remains substantially unchanged upon passing from the normal conduction condition through the filaments 2 to that in which conduction takes place through the peripheral parts of the matrix whenever a superconducting section changes to the normal state.

Moreover, when the process is utilised to form superconducting conductors of rectangular section such as those illustrated in FIG. 3, a heat exchanger and electrical exchange between the filaments 2 and the matrices is obtained which is substantially the same in any of the four directions orthogonal to the sides of the section itself, as opposed to what happened in superconducting conductors provided with a composite matrix obtained by forming a groove in a blank of rectangular section as in the previously described prior art arrangement.

Finally, with the process of the invention it is possible to form a composite matrix with a very high ratio between the volume of the material of the matrix itself and that of the filaments even if the cross section of the superconducting conductor is not rectangular, but is, for example circular, as in the case of FIG. 4; as has in fact previously been made clear, with the known processes previously described it is not possible to form a composite matrix having such a section.

The process also lends itself to the production of conductors having a very small section with maximum transverse dimensions less than 4 to 5 mm.

The process, then, is very simple and economical, being constituted by only a few phases which can be performed in an entirely automatic manner.

It is apparent that the phases of the process described can be modified and varied without by this departing from the scope of the invention itself.

We claim:

1. A process for the production of superconducting conductors of the type comprising a plurality of filaments of an alloy containing niobium and titanium as base material and a composite matrix of copper, aluminum or alloys of these elements in which the filaments are embedded and which serves to stabilize the superconductor, the ratio between the volume of the material of the said matrix and the volume of the said filaments being greater than one, characterized by the fact that it comprises at least a first phase of preparing a first superconducting conductor including the said filaments and a first matrix of copper, aluminum or alloys of these elements;
   (a) a second phase of preparing a strip of copper, aluminum or alloys or these elements, of width substantially equal to the perimeter of the cross section of the said first superconducting conductor;
   (b) a third phase of depositing a layer of brazing material on the outer surface of the said first superconducting conductor and at least on one of the faces of the said strip;
   (c) a fourth phase of connecting the said first superconducting conductor to the said strip and of shaping the strip itself by plastic deformation around the conductor in such a way that this latter is completely enclosed by the strip;
   (d) a fifth phase of heat treating the assembled said first superconducting conductor and said strip in the preceding phases for producing a brazed connection between the said first superconducting conductor and the said strip enclosing it.

2. A process according to claim 1, characterized by the fact that the thickness of the said strip is chosen in such a way to obtain in the said superconducting conductor a ratio greater than one between the sum of the volumes of the material of the said first matrix and of the said strip and the volume of the said filaments, and in any case greater than one.

3. A process according to claim 1, characterized by the fact that it further comprises a phase of finishing the said superconducting conductor after the said fifth phase.

4. A process according to claim 1, characterized by the fact that the said fourth phase is performed by passing the said first superconducting conductor and the said strip transversely through a draw plate operable to shape the strip about the conductor whilst these are passed through it.

5. A superconducting conductor of the type comprising a plurality of filaments of an alloy containing niobium and titanium and a composite matrix of copper, aluminum or alloys of these elements, in which these filaments are disposed and which serves to stabilize the superconductor, characterized by the fact that the superconductor comprises a first superconducting conductor which is provided with said filaments and a first matrix of copper, aluminum or alloys of these elements, and a sheath having a uniform thickness made of copper, aluminum or alloys of these elements which is disposed about the said first superconducting conductor in such a way as completely to enclose it, the said sheath having a pair of longitudinal continuous edges substantially in contact with one another and disposed between the inner surface of the said sheath and the outer surface of the said first superconducting conductor a layer of brazing material operable to form a composite matrix.

6. A superconducting conductor according to claim 5, characterized by the fact that the said first superconducting conductor has a rectangular cross section and the said sheath has two pairs of plane walls.

7. A superconducting conductor according to claim 5, characterized by the fact that the said superconducting conductor has a circular cross-section and the said sheath is constituted substantially by a cylindrical wall.

8. A superconducting conductor according to claim 5, characterized by the fact that the thickness of the said sheath is such as to obtain a ratio greater than one between the sum of the volumes of the said first matrix and the said sheath, and the volume of the said filaments.

* * * * *